(12) United States Patent
Furuta et al.

(10) Patent No.: US 7,638,849 B2
(45) Date of Patent: Dec. 29, 2009

(54) SEMICONDUCTOR DEVICE HAVING SEPARATED DRAIN REGIONS

(75) Inventors: Hiroshi Furuta, Kanagawa (JP); Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 259 days.

(21) Appl. No.: 11/504,074

(22) Filed: Aug. 15, 2006

(65) Prior Publication Data

US 2007/0063288 A1 Mar. 22, 2007

(30) Foreign Application Priority Data

Sep. 6, 2005 (JP) ............................. 2005-258386

(51) Int. Cl.
*H01L 29/94* (2006.01)
(52) U.S. Cl. .................................... 257/365; 365/49.11
(58) Field of Classification Search ................ 257/365; 365/49.11, 154
See application file for complete search history.

(56) References Cited

U.S. PATENT DOCUMENTS

| 4,695,865 | A | * | 9/1987 | Wagenaar | .................... 257/206 |
| 5,847,429 | A | * | 12/1998 | Lien et al. | .................... 257/355 |
| 6,922,094 | B2 | | 7/2005 | Arima et al. | |
| 6,933,526 | B2 | | 8/2005 | So | |
| 2002/0075034 | A1 | * | 6/2002 | Schroeder et al. | ............. 326/26 |
| 2003/0230777 | A1 | | 12/2003 | Kato et al. | |

FOREIGN PATENT DOCUMENTS

| CN | 1431711 A | 7/2003 |
| JP | 2003-273709 A | 9/2003 |
| JP | 2005-191031 A | 7/2005 |

OTHER PUBLICATIONS

P. Mongkolkachit et al., "Design Technique for Mitigation of Alpha-Particle-Induced Single-Event Transients in Combinational Logic," IEEE Transactions on Device and Material Reliability, vol. 3:3, Sep. 2003, pp. 89-92.
N. Seifert, et al., "Frequency Dependence of Soft Error Rates for Sub-Micron CMOS Technologies," IEDM Technical Digest, pp. 323-326, (2001).

* cited by examiner

*Primary Examiner*—Thomas L Dickey
(74) *Attorney, Agent, or Firm*—Foley & Lardner LLP (57) ABSTRACT

A semiconductor device according to an embodiment of the invention includes: a plurality of field effect transistors; and a plurality of logic circuits composed of the field effect transistors, the field effect transistors each including: first and second drain regions formed away from each other; at least one source region formed between the first and second drain regions; and a plurality of gate electrodes formed between the first drain region and the source region and between the second drain region and the source region.

10 Claims, 8 Drawing Sheets

SEMICONDUCTOR DEVICE HAVING SEPARATED DRAIN REGIONS

BACKGROUND OF THE INVENTION

1. Field of the Invention

The present invention relates to a semiconductor device, and more particularly to a semiconductor device layout effective for suppressing soft errors.

2. Description of Related Art

Along with recent miniaturization in a semiconductor process of a semiconductor device composed of field effect transistors such as MOSFETs, a transient error (soft error) resulting from radiation (for example, high-energy neutron radiation, thermal neutron radiation, and a radiation) has been recognized as a problem. As an example of the soft error, there is SEU (Single Event Upset) that logic inversion occurs due to charges accumulated in a node decrease due to charges resulting from radiation. In general, the occurrence of the SEU depends on a trade-off between an amount of charges accumulated in an information storage node (node voltage*node capacitance) and an amount of charges gathered to the information storage node (collected charge amount) out of the charges generated in a substrate due to radiation. The collected charge amount is generally proportional to an area (volume, to be exact) of the information storage node. As a result of experiments made by the inventors of the present invention, it is revealed that a smaller diffusion layer has a higher resistance to the SEU as long as a voltage level is constant. If a voltage decreases due to miniaturization, the decreasing rate is determined depending on a relation between the accumulated charge amount and the collected charge amount as mentioned above.

The SEU causes a problem of, for example, data inversion that data stored in a memory cell is different from the original data. To give a typical countermeasure against the SEU, a capacitor is added to the storage node or an ECC (Error Correction Code) is added to a circuit.

The memory cell can avoid the SEU by taking the above countermeasure. However, if this countermeasure is adopted against a SEU that occurs in a circuit transmitting a clock signal or the like, an operational speed is reduced or a chip area is considerably increased, so this countermeasure is inappropriate.

In contrast to the SEU (data inversion) of the memory cell, SET (Single Event Transient) is a signal transmission error resulting from a noise generated by radiation being emitted to a signal transmitting logic circuit (hereinafter referred to as "dynamic circuit" for convenience sake).

Regarding the SET, it is reported by Norbert Seifert, et al. in "Frequency Dependent of Soft Error Rates for Sub-micron CMOS Technologies" that the SEU is more likely to occur in a circuit having more signal paths and higher operational frequency. This relation can be expressed as model expressions, Expressions 1 and 2:

$$\text{Pset} \propto f(f = \text{operational frequency}) \quad (1)$$

$$\text{Pset} \propto N(N = \text{target signal path}) \quad (2)$$

where Pset represents an error occurrence rate.

That is, as an operational frequency of a semiconductor integrated circuit improves, the occurrence of the SET increases as understood from Expression 1. As miniaturization in the semiconductor process proceeds and a circuit is upsized, the occurrence of the SET increases as understood from Expression 2.

As a countermeasure against the SET, a technique of preventing the SET using a majority circuit or a coincidence circuit is described in Pitsini Mongkolkachit et al., "Design Technique for Mitigation of Alpha-Particle-Induced Single-Event Transients in Combinational Logic". However, incorporating the majority circuit or coincidence circuit increases a circuit area, so there is a possibility that necessary functional parts cannot be embedded in a limited area.

Figure 7:
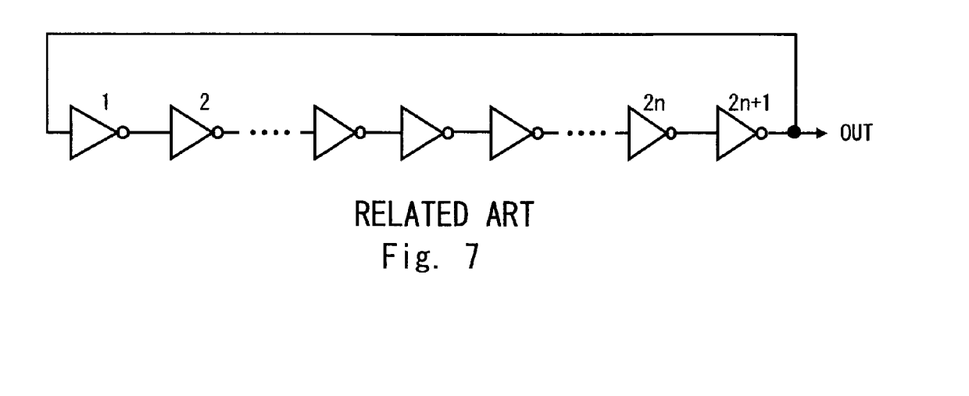
FIG. 7 is a circuit diagram of a conventional ring oscillator circuit.

In general, most blocks of the semiconductor integrated circuit have an active mode and a suspend mode. The SET is an error that occurs in the active mode. As understood from the above explanation, parts that are operating at high speeds all the time most need the measure for the SET. Examples of the parts include a ring oscillator circuit for generating an internal clock of the semiconductor integrated circuit. FIG. 7 shows an example of a conventional typical ring oscillator circuit.

Figure 8:
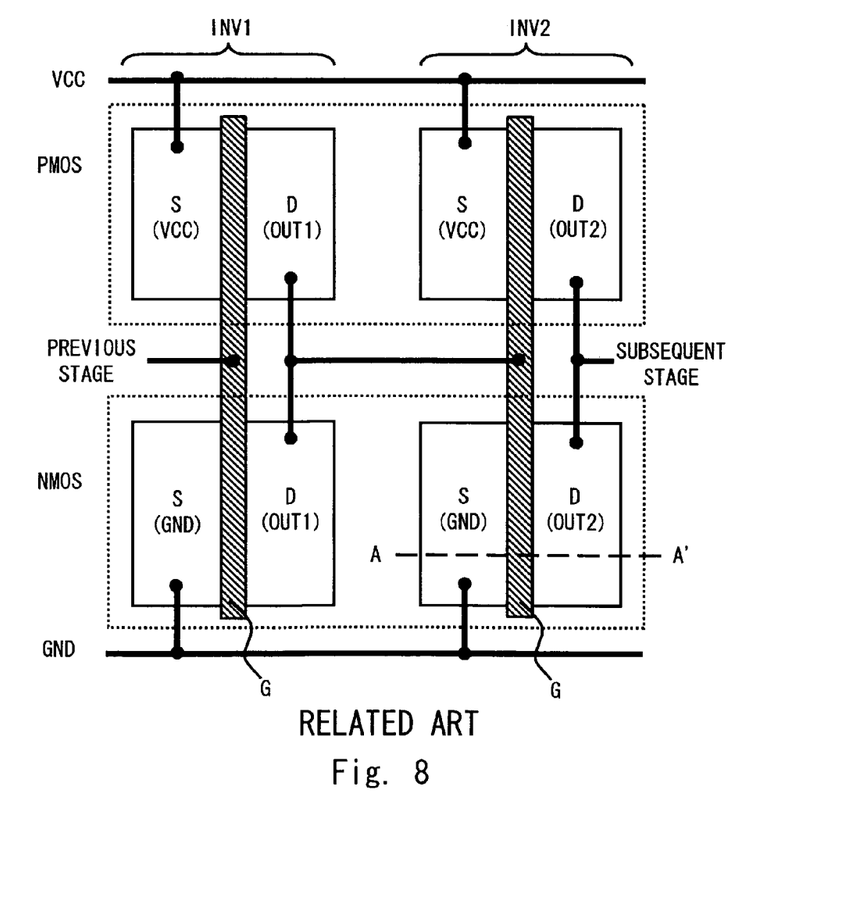
FIG. 8 shows a layout example of two of inverter circuits of the conventional ring oscillator circuit.

In the ring oscillator circuit of FIG. 7, an odd number of inverter circuits are connected in series, and an output of the last inverter circuit is an input of the first inverter circuit. FIG. 8 shows a layout example of two of inverter circuits that constitute the ring oscillator circuit.

As shown in FIG. 8, in the inverter circuits, a PMOS transistor is arranged on the power supply potential VCC line side, and an NMOS transistor is arranged on the ground potential GND line side. A gate electrode G is shared between the PMOS transistor and the NMOS transistor. Source regions S of the PMOS transistor and the NMOS transistor are formed adjacent to one side of the gate electrode G, and drain regions D of the PMOS transistor and the NMOS transistor are formed adjacent to the other side of the gate electrode. Further, the source region S of the PMOS transistor is connected with a power supply potential VCC, and the source region S of the NMOS transistor is connected with a ground potential GND. Moreover, the drain regions D of the PMOS transistor and the NMOS transistor are connected with each other, and an interconnection therebetween is an output of each inverter circuit. Components of the ring oscillator circuit are laid out such that the inverter circuits are connected in series.

Figure 9:
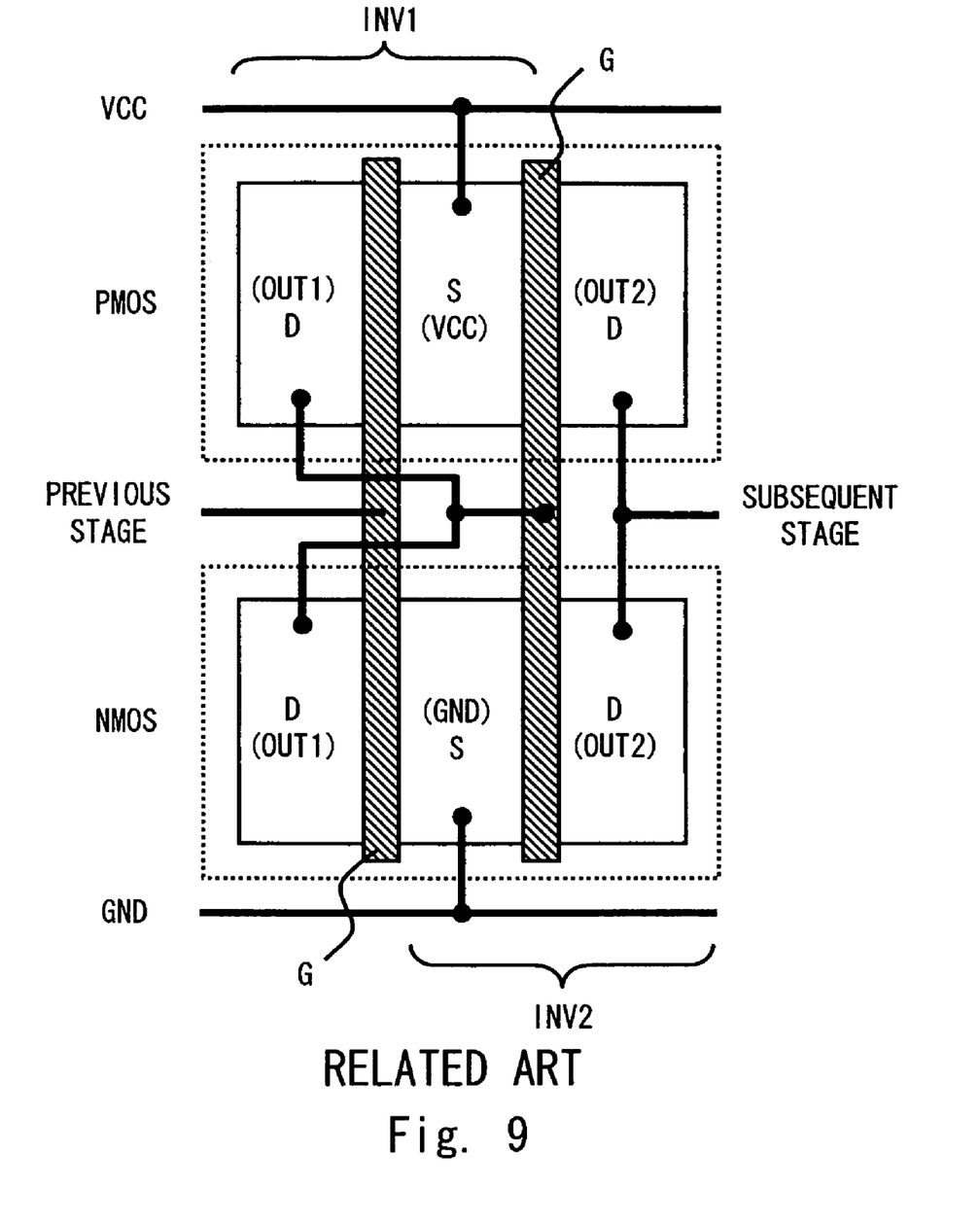
FIG. 9 shows another layout example of two of the inverter circuits of the conventional ring oscillator circuit.

FIG. 9 shows another layout example of the inverter circuit. The inverter circuit of FIG. 9 is different from that of FIG. 8 in that a common source region S is used in place of the two source regions S of the two inverter circuit of FIG. 8 to thereby reduce a layout area.

However, if radiation is applied to an output of the inverter circuit with the ring oscillator circuit layout of FIGS. 8 and 9, a logic type of an output is inverted and a phase of a generated clock is shifted, which causes the SET in some cases. The clock phase shift leads to a problem in that a synchronizing circuit using the clock causes a malfunction. This logic inversion is described in detail below.

Figure 10:
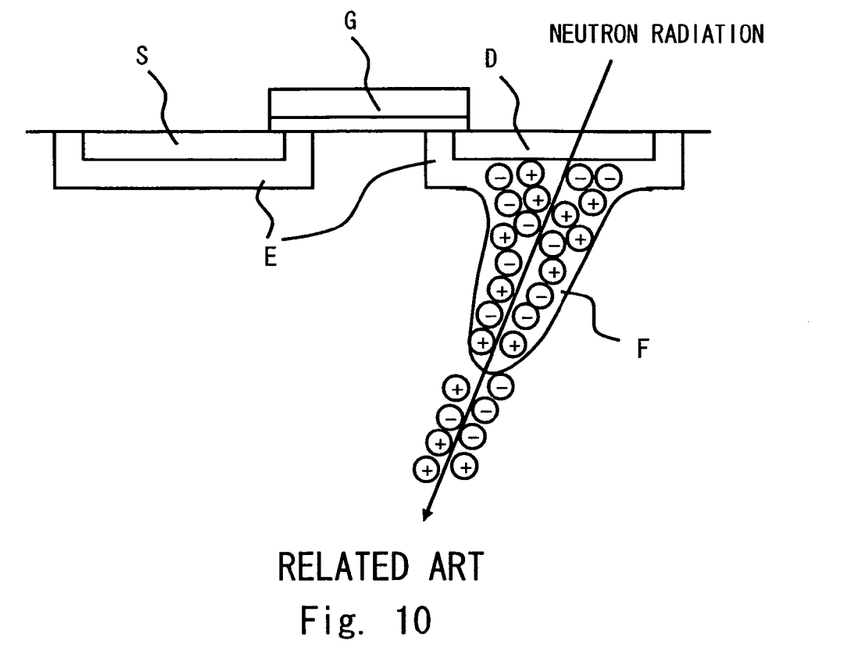
FIG. 10 is a schematic diagram of charges generated upon the incidence of radiation to a drain region of an NMOS transistor.

FIG. 10 is a sectional view taken along the line A-A' of the inverter circuit of FIG. 8 in the case of applying the radiation to a drain of the NMOS transistor. The NMOS transistor has a source S, a gate G, and a drain D, and a depletion layer E is formed around the source and the drain. When the radiation is applied to the drain of the NMOS transistor, a pair of hole and electron is generated in orbit. At this time, the depletion layer seems enlarged due to an electric field generated by the pair of hole and electron. This area is called a "funneling area F".

Figure 11:
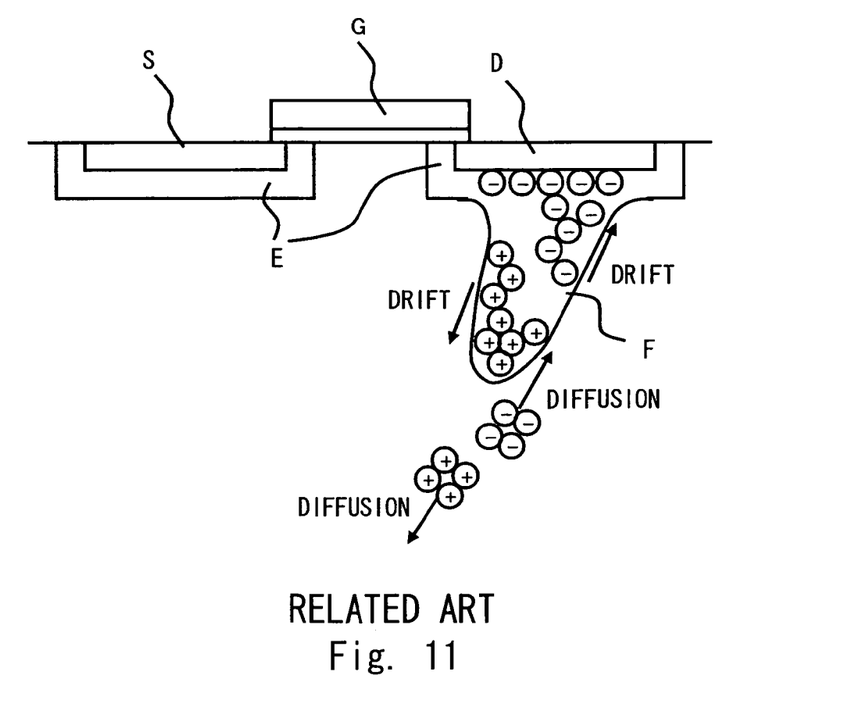
FIG. 11 is a schematic diagram showing the movement of the charges generated upon the incidence of radiation to the drain region of the NMOS transistor.

As shown in FIG. 11, in the depletion layer E and the funneling area F, holes and electrons move due to drift or diffusion. Thus, when electrons gather in the drain D, the electrons are accumulated in the drain D of the NMOS transistor. As a result, even if the output of the inverter circuit is at High level (for example, power supply potential), the output potential of the inverter circuit decreases to Low level (for example, ground potential) in some cases.

As a solution to the above problem, Japanese Unexamined Patent Application Publication No. 2003-273709 discloses a technique of avoiding the inversion of an output of a flip-flop or the like. However, a circuit disclosed in Japanese Unexamined Patent Application Publication No. 2003-273709 is intended to prevent the inversion of stored data by adding an element to an output stage. Thus, there is a problem in that this circuit cannot be applied to a circuit that operates all the time like the ring oscillator circuit.

SUMMARY OF THE INVENTION

A semiconductor device according to an aspect of the invention includes: a plurality of field effect transistors; and a plurality of logic circuits composed of the field effect transistors, the field effect transistors each including: first and second drain regions formed away from each other; at least one source region formed between the first and second drain regions; and a plurality of gate electrodes formed between the first drain region and the source region and between the second drain region and the source region.

A semiconductor device according to another aspect of the invention includes: a plurality of field effect transistors; and a plurality of logic circuits having storage nodes composed of the field effect transistors, the field effect transistors each including: first and second drain regions formed away from each other; at least one source region formed between the first and second drain regions; and a plurality of gate electrodes formed between the first drain region and the source region and between the second drain region and the source region.

According to the semiconductor device of the present invention, since the drain regions are formed away from each other, even if radiation is applied to one drain region, and holes or electrons (collectively referred to as "charges") are generated, an amount of collected charges relative to the total drain area is smaller than that of a field effect transistor having only one drain region. Thus, it is possible to prevent inversion of a logic type of a drain region.

Further, since the drain region is enlarged to increase a node capacitance, even if charges are generated due to the radiation, a potential change of the drain region can be suppressed.

Further, the drain regions are formed on opposite sides of the source region, so charges rarely gather into each drain region at the same time. This is because, even if charges are generated in one drain region, the charges are mostly absorbed by the source region interposed between the drain regions, and an amount of charges that reach the other drain region can be reduced. Accordingly, a logic type of the drain region is hardly inverted, so an SET resistance can be increased.

Furthermore, drain regions are formed away from each other, and a common source region is provided for the drain regions, whereby a layout area of the source region can be reduced, making it possible to minimize the total layout area.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
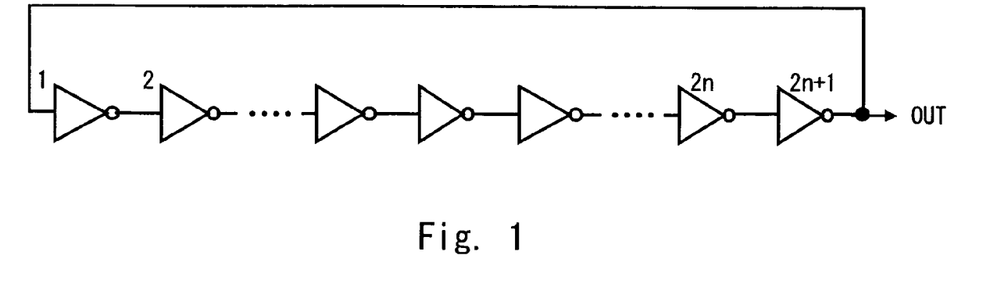
FIG. 1 is a circuit diagram of a ring oscillator circuit according to a first embodiment of the present invention.
Figure 2:
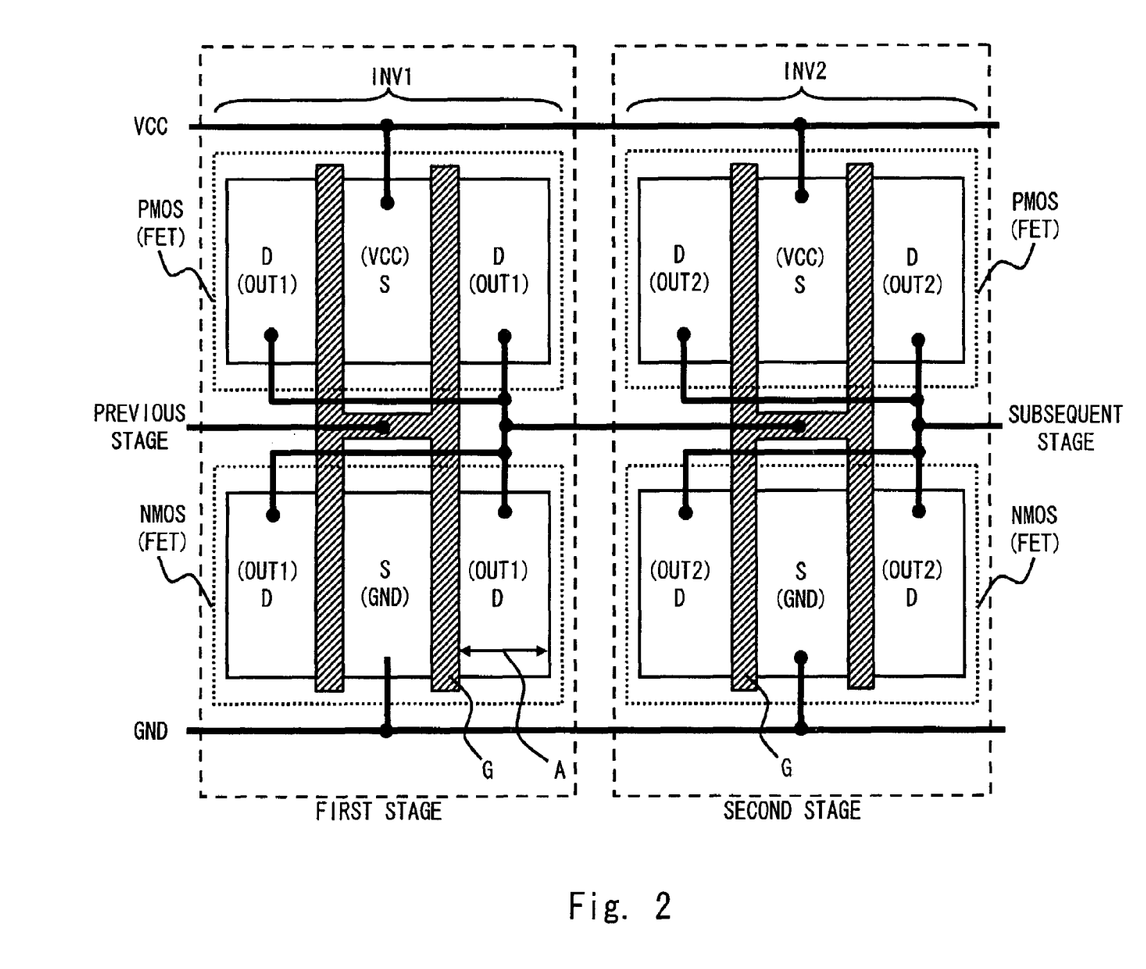
FIG. 2 shows a layout of two of inverter circuits of the ring oscillator circuit of the first embodiment.

FIG. 1 shows an oscillating circuit according to a first embodiment of the present invention (for example, ring oscillator circuit). As shown in FIG. 1, the ring oscillator circuit is composed of an odd number of logic circuits (for example, inverter circuit) which are connected in series. The ring oscillator circuit of this embodiment is formed on, for example, a silicon semiconductor substrate. FIG. 2 shows a layout of two of inverter circuits that constitute the ring oscillator circuit.

Referring to FIG. 2, the layout of the first embodiment is described in detail. As shown in FIG. 2, each inverter circuit has two field effect transistors (for example, PMOS transistor and NMOS transistor). The inverter circuits are connected in series so as to function as the ring oscillator circuit. In the following description, the direction from the left to the right of FIG. 2 is referred to as the X direction, and the upward direction of FIG. 2 is referred to as the Y direction. The description is also focused on one inverter circuit.

The inverter circuit includes ground lines GND that extend in the X direction, and power supply lines VCC that extend in the X direction. The lines are arranged in the order of the ground line GND and the power supply line VCC along the Y direction. An NMOS transistor and a PMOS transistor are formed between the ground line GND and the power supply line VCC.

The ground line GND is connected with a source region S of the NMOS transistor. The power supply line VCC is connected with a source region S of the PMOS transistor. Further, the PMOS transistor and the NMOS transistor share a gate electrode G, and the gate electrode is connected with an output of a previous inverter circuit. The drain region D of the PMOS transistor is connected with the drain region D of the NMOS transistor, and an interconnection therebetween is an output of the inverter circuit. The output is connected with a gate electrode G of a subsequent inverter circuit.

The gate electrode G extends in the Y direction and has a rectangular shape. Two gate electrodes G are formed for each transistor pair (the NMOS transistor and the PMOS transistor), and are connected in a region not including the source region S and the drain region D of the transistor. That is, the gate electrode G is such that plural gate electrodes are connected together to function as a gate electrode of one MOS transistor. In this embodiment, the gate electrode G is formed in the H shape over the PMOS and NMOS transistors.

The source regions S of the NMOS transistor and the PMOS transistor are sandwiched between the two gate electrodes G inside each transistor. Further, the drain regions D of the NMOS transistor and the PMOS transistor oppose the source region S across the gate electrodes G inside each transistor. That is, the layout of each transistor is such that the drain region D, the gate electrode G, the source region S, the gate electrode G, and the drain region D are arranged in this order along the X direction as viewed from above. The separate drain regions (first and second drain regions) are connected through lines to operate as one drain region.

In FIG. 2, the two inverter circuits that are configured in accordance with the above layout are arranged in the X direction. The ring oscillator circuit can be attained by connecting the above inverter circuits in series.

As understood from the above description, components of a semiconductor device of the present invention are laid out such that plural drain regions D separated in one transistor are connected together through lines to operate as one drain region, and a common source region is provided for the plural drain regions D. As a result, even if radiation is applied to one drain region D and holes or electrons (collectively referred to as "charges") are generated, the charges are accumulated in the one drain region (one separated drain region). At this time, the charges are absorbed to the source region S sandwiched between the drain regions D, so the charges are hardly accumulated in the other drain region D. Hence, even if charges gather in one drain region D, and an amount of charges originally accumulated in the drain region D decreases, a potential change of the drain region D can be suppressed using charges accumulated in the other drain region D. Accordingly, it is possible to prevent the logic inversion of an output node.

In such a conventional layout that only one drain region D is provided, when charges are generated due to the radiation, charges gather in one drain region D, so a large percentage of the original charges accumulated in the drain region D disappear, and a potential level is largely changed. This results in a problem of the inversion of a logic type of the output node.

In the layout of this embodiment, one source region S is formed for two drain regions D. That is, since the number of source regions S is smaller than the number of drain regions D, the number of drain regions D is increased but an increase in layout area can be minimized. On the other hand, a conventional transistor has one source region, one drain region and one gate electrode. Two conventional transistors have to be connected in order to form a transistor having separated drain regions. Therefore, layout area of the transistor having separated drain regions is enlarged. Further, as compared with a majority circuit or coincidence circuit, a resistance to the SET can be improved with a small layout area.

In this embodiment, a drain region of one MOSFET is divided into two regions. This is undesirable in terms of circuit characteristics because an output capacitance of the inverter circuit increases. Thus, up to now, there is no attempt to connect plural inverter circuits configured as above to function as the oscillating circuit.

The problem of the present invention in terms of the circuit characteristics is not so serious because a diffusion layer width A of 0.5 μm or less is realized in the drain region with today's advanced miniaturization technique. The small diffusion layer width A means that an amount of charges generated due to the radiation application and collected is small. Hence, as a more preferred embodiment of the invention, the drain diffusion layer width A is reduced without deteriorating the MOSFET characteristics.

When a power supply voltage is 1.5 V or lower, a beneficial effect of the present invention is brought to the fore. At the power supply voltage of 1.5 V or lower, a change amount of the diffusion layer decreases, so the device is easily affected by charges generated in the substrate due to the radiation even if an amount of collected charges is small. Thus, in the conventional layout of the inverter circuits, the device is more affected by the charges when the power supply voltage is lowered. The beneficial effect of the present invention is more exerted if the miniaturization further proceeds and the power supply voltage is more reduced.

Second Embodiment

Figure 3:
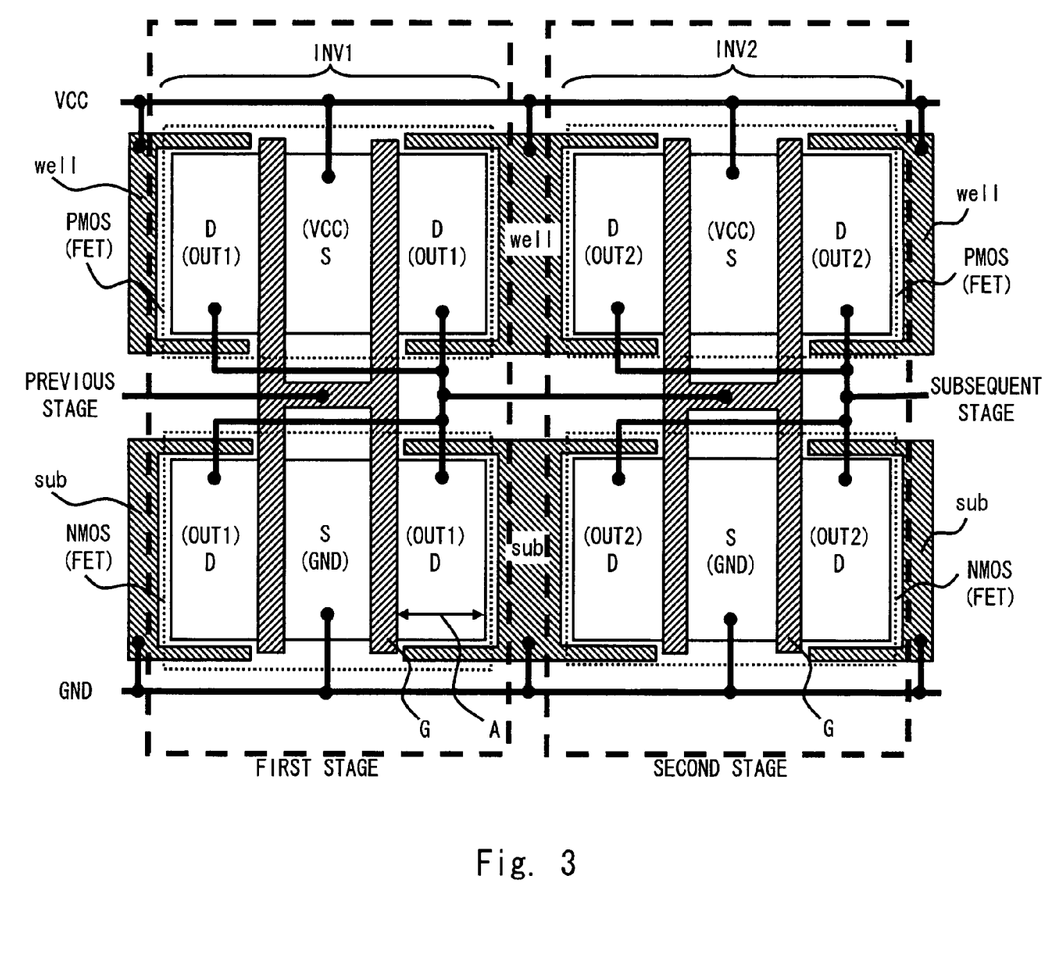
FIG. 3 shows a layout of two of inverter circuits of a ring oscillator circuit according to a second embodiment of the present invention.

FIG. 3 shows a layout of an inverter circuit according to a second embodiment of the present invention. The layout of the inverter circuit of the second embodiment differs from that of the inverter circuit of the first embodiment in that a well potential diffusion layer region well (N-type diffusion layer) and a substrate potential diffusion layer region sub (P-type diffusion layer) are added between the two inverter circuits. The same layout portion as that of the first embodiment is assigned with identical reference numerals and description thereof is omitted here.

The layout of the inverter circuit of the second embodiment is described as below. The inverter circuit of the second embodiment has the well potential diffusion layer region well and the substrate potential diffusion layer region sub provided between two adjacent inverter circuits. The well potential diffusion layer region well is connected with the power supply potential VCC, and is formed between two adjacent PMOS transistors. Further, the well potential diffusion layer region well is bounded on three sides out of four sides by each drain region of the PMOS transistor; the three sides are not adjacent to the gate electrode.

The substrate potential diffusion layer region sub is connected with the ground potential GND, and is formed between two adjacent NMOS inverter circuits. Further, the substrate potential diffusion layer region sub is bounded on three sides out of four sides by each drain region of the NMOS transistor; the three sides are not adjacent to the gate electrode.

With the above layout, even if radiation enters the device while passing through plural elements, for example, generated charges are absorbed by the well potential diffusion layer region well or the substrate potential diffusion layer region sub. Therefore, elements not applied with the radiation can suppress an influence of the charges generated due to the radiation. Accordingly, the inverter circuit of the second embodiment enables a higher resistance to the SET than the inverter circuit of the first embodiment.

Third Embodiment

Figure 4:
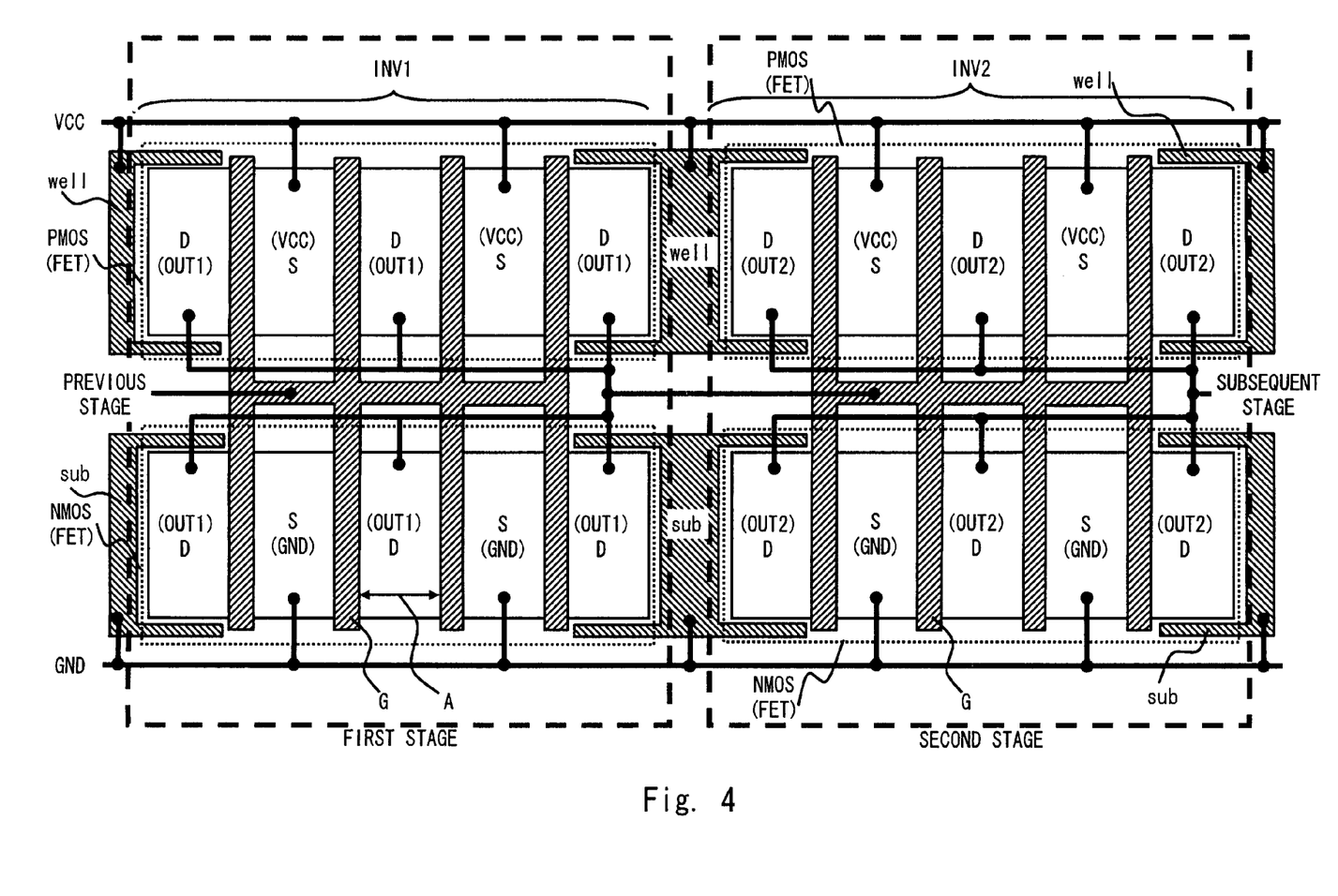
FIG. 4 shows a layout of two of inverter circuits of a ring oscillator circuit according to a third embodiment of the present invention.

FIG. 4 shows a layout of an inverter circuit according to a third embodiment of the present invention. A layout of the inverter circuit of the third embodiment differs from that of the inverter circuit of the second embodiment in that the numbers of source regions and drain regions of each transistor are increased. The same layout portion as that of the second embodiment is denoted by identical reference numerals, and description thereof is omitted here.

The layout of the inverter circuit of the third embodiment is described in detail below. The layout of the inverter circuit of the third embodiment is substantially the same as that of the inverter circuit of the first embodiment. The following description is focused on a difference between the first embodiment and the third embodiment.

The gate electrode G of this embodiment extends in the Y direction with a rectangular shape. Four gate electrodes G are provided for each transistor pair (the NMOS transistor and the PMOS transistor) and are connected together in a portion not including the source region S and the drain region D of the transistor.

The source regions S of the NMOS transistor and the PMOS transistor are provided such that each transistor has two source regions. Further, the drain region D of the NMOS transistor and the PMOS transistor is divided into three regions in each transistor. Elements of each transistor are laid out as follows: the drain region D, the gate electrode G, the source region S, the gate electrode G, the drain region D, the gate electrode G, the source region S, the gate electrode G, and the drain region D are arranged in this order along the X direction as viewed from above.

With the above layout, although the drain region is divided into two regions in the first and second embodiments, the drain region of the inverter circuit of the third embodiment is divided into three. As a result, even if radiation is applied to one drain region and charges originally accumulated in the drain region decrease, charges accumulated in the remaining two drain regions are kept, thereby making it possible to suppress a change in output voltage as compared with the first and second embodiments.

In addition, since the well potential diffusion layer region well and the substrate potential diffusion layer region sub are formed between the inverter circuits, an influence of generated charges on adjacent elements can be minimized as in the second embodiment.

Fourth Embodiment

Figure 5:
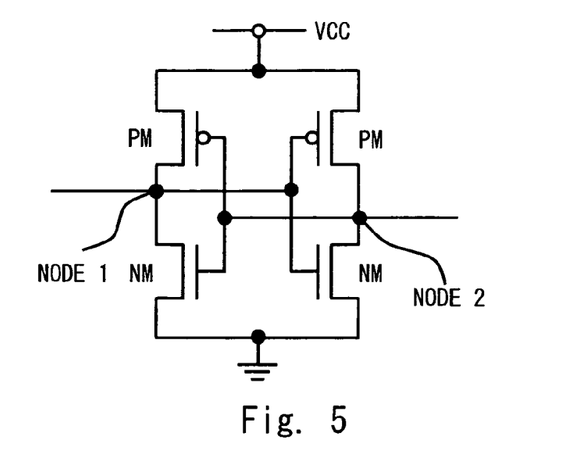
FIG. 5 is a circuit diagram of a flip-flop according to a fourth embodiment of the present invention.

A fourth embodiment of the invention explains an example where the above transistor is used in a storage node of a flip-flop. FIG. 5 shows the flip-flop of the fourth embodiment. The flip-flop of FIG. 5 has two pairs of PMOS transistor PM and NMOS transistor NM which are connected to constitute an inverter circuit, and the inverter circuit pair serves as a storage cell. Two storage nodes correspond to output terminals of the inverter circuits of the storage cell; one node is referred to as "node 1", and the other is referred to as "node 2".

Figure 6:
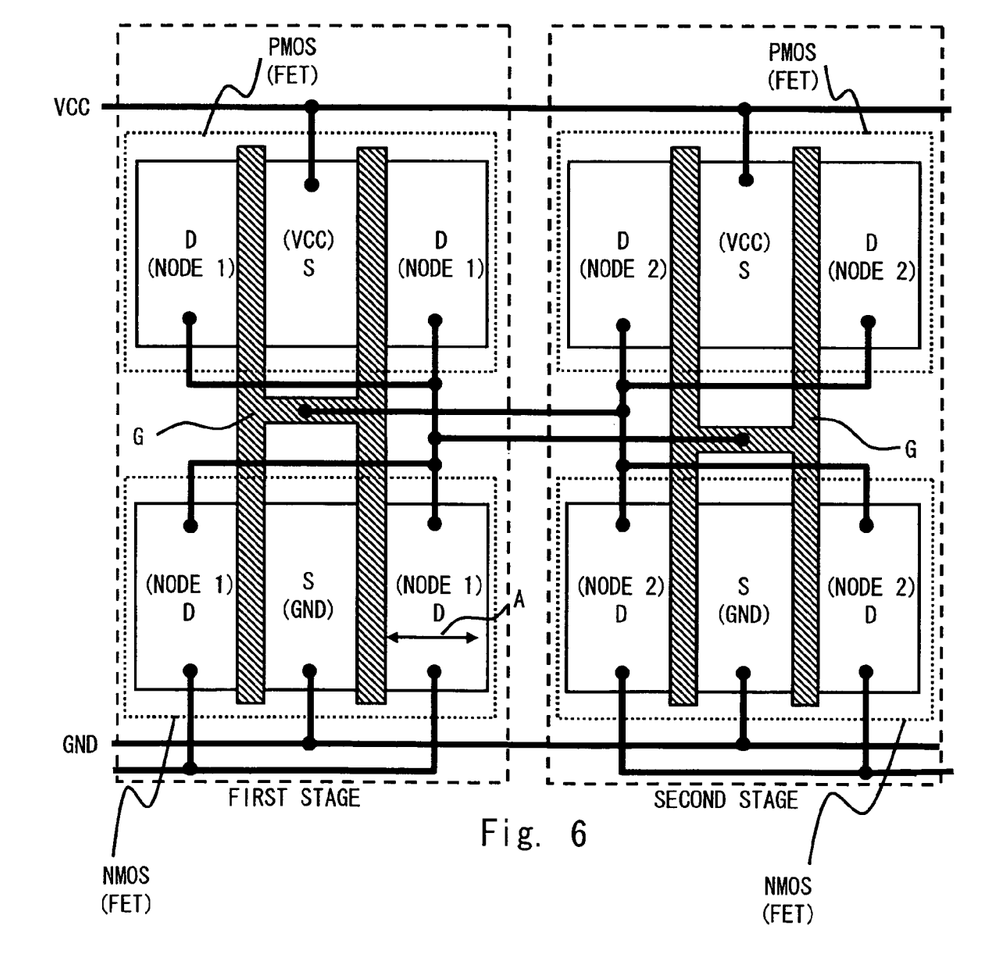
FIG. 6 shows a layout of the flip-flop of the fourth embodiment.

FIG. 6 shows a layout of the flip-flop. As shown in FIG. 6, transistors as the storage node of the flip-flop are formed between the power supply line VCC and the ground line GND. In this example, a layout of transistor elements used in the storage node of the flip-flop is the same as that of the inverter circuit of the first embodiment.

Each transistor as the storage node of the flip-flop has two drain regions D and one source region S. The gate electrode G is formed between each drain region D and the source region S. In this example, two gate electrodes G are provided across the PMOS transistor and the NMOS transistor and are connected. In this embodiment, the gate electrode is formed in the H-like shape.

The two drain regions D of each transistor of the storage node of the flip-flop are connected through lines to thereby constitute the storage node (for example, node 1 or node 2).

The transistors of FIG. 6 are connected based on the circuit diagram of FIG. 5.

As described above, if the layout of the fourth embodiment is applied to the transistors as the storage node, even when radiation is emitted to one of the drain regions D as the storage node, a potential change of the storage node can be suppressed using charges accumulated in the other drain region D. That is, the layout of the fourth embodiment can also suppress the occurrence of soft errors like SEU.

Further, the flip-flop can be utilized as an SRAM (Static Random Access Memory) cell.

As other embodiments of the present invention, the flip-flop may be configured based on the element layout of the present invention, for example. Consequently, a resistance of the flip-flop to the soft error can be improved. Further, if elements arranged in accordance with the layout of the first embodiment are placed away from each other and connected in parallel through lines, a resistance to the soft error can be also improved.

The above embodiments describe the MOSFET by way of example, but the transistor may be a MISFET (Metal Insulator Semiconductor Field Effect Transistor) that is widely used in a finer-design-rule process.

It is apparent that the present invention is not limited to the above embodiment that may be modified and changed without departing from the scope and spirit of the invention.

What is claimed is:

1. A semiconductor device comprising:
   a plurality of field effect transistors; and
   a plurality of logic circuits composed of the field effect transistors,
   the field effect transistors each comprising:
      first and second drain regions formed physically away from each other, wherein the first and second drain regions are electrically connected together to function as one drain region;
      at least one source region formed between the first and second drain regions; and
      a plurality of gate electrodes formed between the first drain region and the source region and between the second drain region and the source region,
   wherein the logic circuits comprise an oscillator circuit in which the plurality of logic circuits are connected in series.

2. The semiconductor device according to claim 1, wherein the first and second drain regions are interposed between the source regions, or between the source region and a well potential diffusion layer region or a substrate potential diffusion layer region.

3. The semiconductor device according to claim 1, wherein in the field effect transistor, the number of drain regions formed away from each other is larger than the number of source regions.

4. The semiconductor device according to claim 1, wherein the plurality of gate electrodes are connected together to function as one gate electrode.

5. The semiconductor device according to claim 1, wherein a diffusion layer width of each of the drain regions is 0.5 μm or smaller.

6. The semiconductor device according to claim 1, wherein a power supply voltage of a circuit composed of the field effect transistors is 1.5 V or lower.

7. The semiconductor device according to claim 1, wherein said oscillator circuit has a first stage and a second stage, said oscillator circuit having an isolation region between a first drain region of said first stage and a second drain region of said second stage.

8. A semiconductor device comprising:

a plurality of field effect transistors; and a plurality of logic circuits composed of the field effect transistors, the field effect transistors each comprising:

first and second drain regions formed physically away from each other, wherein the first and second drain regions are electrically connected together to function as one drain region;

at least one source region formed between the first and second drain regions; and a plurality of gate electrodes formed between the first drain region and the source region and between the second drain region and the source region, wherein the logic circuits comprise a flip-flop circuit.

9. The semiconductor device according to claim 8, wherein the flip-flop circuit is an SRAM cell.

10. A semiconductor device comprising:

a logic circuit which has two stages; and one of said stages having two field effect transistors, each of the two field effect transistors having:

two gate electrodes;

a source region which is formed between the two gate electrodes; and first and second drain regions provided so that the respective gate electrode is inserted between said source region and the respective drain region, wherein said first and second drain regions of said first stage connects to said gate electrode of said second stage and do not connect to said gate electrode of said first stage.

* * * * *